(12) United States Patent
Scaringe (10) Patent No.: US 6,205,803 B1
(45) Date of Patent: *Mar. 27, 2001

(54) COMPACT AVIONICS-POD-COOLING UNIT THERMAL CONTROL METHOD AND APPARATUS

(75) Inventor: Robert Peter Scaringe, Rockledge, FL (US)

(73) Assignee: Mainstream Engineering Corporation, Rockledge, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/639,893

(22) Filed: Apr. 26, 1996

(51) Int. Cl.[7] .............................. F25B 41/00; F25B 49/00; F25B 1/00; F25D 31/00
(52) U.S. Cl. ......................... 62/259.2; 62/196.4; 62/183; 62/513; 62/238.6; 165/140; 165/263; 165/104.33; 165/80.4
(58) Field of Search .................................. 62/196.4, 183, 62/259.2, 513, 238.6; 165/140, 104.33, 80.4

(56) References Cited

U.S. PATENT DOCUMENTS

| | | | | |
|---|---|---|---|---|
| 2,742,765 | * | 4/1956 | Anderson | 62/196.4 |
| 2,761,287 | * | 9/1956 | Malkoff et al. | 62/196.4 |
| 2,869,330 | * | 1/1959 | Kramer | 62/196.4 |
| 2,986,899 | * | 6/1961 | Schenk et al. | 62/196.4 |
| 3,188,829 | * | 6/1965 | Siewert et al. | 62/196.4 |
| 3,203,196 | * | 8/1965 | Malkoff et al. | 62/196.4 |
| 3,248,895 | * | 5/1966 | Mauer | 62/196.4 |
| 3,498,073 | * | 3/1970 | Kusuda et al. | 62/196.4 |
| 3,734,810 | * | 5/1973 | Davis | 62/196.4 |
| 3,822,562 | * | 7/1974 | Crosby | 62/196.4 |
| 3,933,004 | * | 1/1976 | Carter et al. | 62/196.4 |
| 4,068,494 | * | 1/1978 | Kramer | 62/196.4 |
| 4,256,475 | * | 3/1981 | Schafer | 165/140 |
| 4,270,363 | * | 6/1981 | Maring et al. | 62/196.4 |
| 4,274,481 | * | 6/1981 | Ireland et al. | 165/140 |
| 4,328,682 | * | 5/1982 | Vana | 62/196.4 |
| 4,506,520 | * | 3/1985 | McCord | 62/196.4 |
| 4,862,702 | * | 9/1989 | O'Neal | 62/196.4 |
| 5,168,715 | * | 12/1992 | Nakao et al. | 62/196.4 |
| 5,230,223 | * | 7/1993 | Hullar et al. | 62/196.4 |
| 5,291,941 | * | 3/1994 | Enomoto et al. | 62/196.4 |
| 5,415,006 | * | 5/1995 | Renken et al. | 62/196.4 |
| 5,575,158 | * | 11/1996 | Vogel | 62/196.4 |

FOREIGN PATENT DOCUMENTS

| | | | | |
|---|---|---|---|---|
| 3303636 | * | 8/1984 | (DE) | 62/259.2 |
| 0295377 | * | 12/1988 | (EP) | 62/196.4 |
| 0184366 | * | 7/1989 | (JP) | 62/196.4 |
| 1-256775 | * | 10/1989 | (JP) | 62/259.2 |
| 0254263 | * | 10/1990 | (JP) | 62/196.4 |
| 3-70975 | * | 3/1991 | (JP) | 62/259.2 |
| 3-164661 | * | 7/1991 | (JP) | 62/196.4 |
| 518644 | * | 1/1993 | (JP) | 62/196.4 |

* cited by examiner

Primary Examiner—John K. Ford
(74) Attorney, Agent, or Firm—Evenson, McKeown, Edwards & Lenahan, P.L.L.C.

(57) ABSTRACT

A thermal control method and apparatus flows refrigerant of a vapor compression system through a plate of an avionics pod so as to provide a compact and efficient cooling technique for aircraft performing a variety of missions. The plate can serve as an evaporator in a heat pump loop or a heat exchanger in a pumped coolant loop. As a result, the same components can be used for convection cooling and compressor-assisted cooling. At lower temperatures, the pump is operational whereas under less favorable conditions the compressor is operable. A bypass can be provided to provide thermal control where ambient temperature is excessively low. A water boiler can also be utilized when, for short periods, the ambient temperature is higher than the desired temperature for the electronics package.

1 Claim, 12 Drawing Sheets

DIRECT CONVECTIVE HEAT TRANSFER

Fig. 1
PRIOR ART

INDIRECT CONVECTIVE HEAT TRANSFER

COMPACT AVIONICS-POD-COOLING UNIT THERMAL CONTROL METHOD AND APPARATUS

BACKGROUND AND SUMMARY OF THE INVENTION

The present invention relates to a method and apparatus for compact thermal control for avionics pod cooling units. More particularly, the present invention relates to thermal control in which refrigerant is circulated adjacent to the pod in a closed loop system in which the electronic cold plate can also serve as an evaporator in a heat pump loop or a heat exchanger in a pumped coolant loop.

Today's typical fighter aircraft must fly both numerous missions and different types of missions. One way to provide such aircraft with varying capabilities is to attach a particular type of avionics (electronics) pod below the aircraft with mission specific electronics contained therein. In this way, attachment of particular pod configures the aircraft for that particular mission. In using a pod, however, there are size, weight, and electrical consumption constraints. In addition, little space is available for the required cooling of the electronics contained in the pod in order to prevent overheating of the electronics. Typically, the cooling system is crammed into the back of the pod because the antenna for the electronics typically must utilize the front of the pod.

A known way to cool electronics pods is via direct or indirect convective heat transfer with the air surrounding the pod. Direct or indirect cooling of all the electronics in a typical pod merely with the air passing by the pod is, however, not practical for most electronics which typically must be kept at or around ambient air temperature, but during supersonic flight at low altitude the ambient air temperature can easily exceed 100° C. (212° F.).

Figure 1:
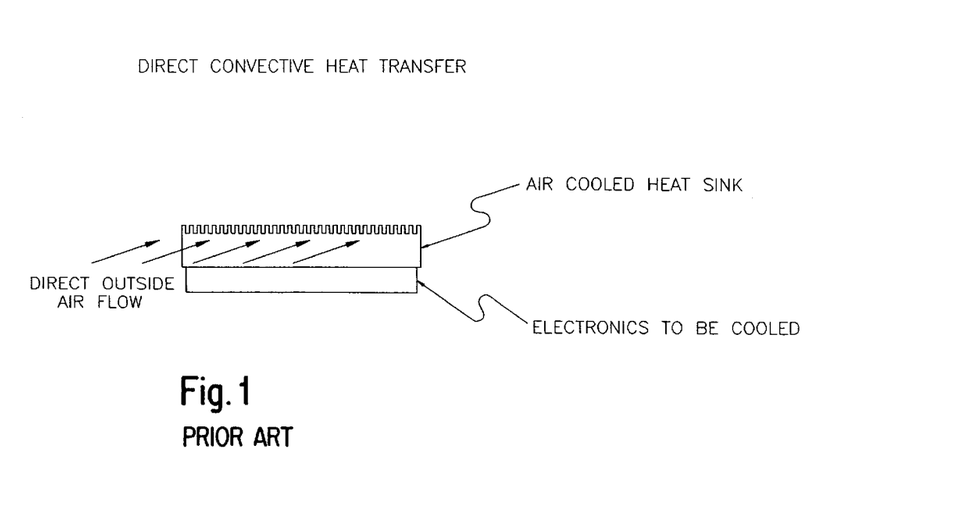
FIG. 1 is a schematic diagram of the above-discussed conventional direct convection cooling arrangement for an electronics pod.

Cooling on the ground, e.g., preflight check-out, is also required for periods ranging from thirty minutes to several hours. A simple convection air cooling method would therefore require a ground cooling cart to pre-cool the air on the ground. Direct convection cooling would occur by diverting some of the air flow which is passing by the pod and directing this air against the electronics being cooled. For example, FIG. 1 shows a conventional arrangement in which an electronics pod is mounted on a finned heat exchanger.

Figure 2:
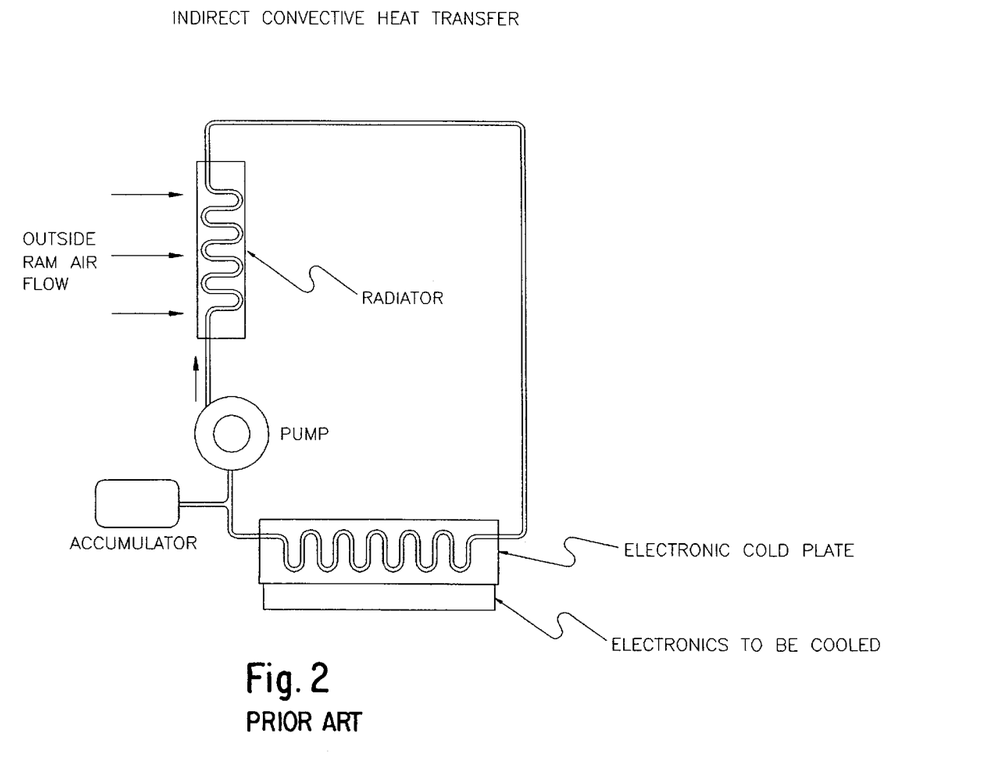
FIG. 2 is a schematic diagram of the above-discussed conventional indirect convective cooling arrangement using a closed loop with single-phase coolant.

Indirect convection cooling can occur by using a conventional heat exchanger, i.e. a radiator, in the air flow and pump a coolant around a loop from this heat exchanger to heat exchangers, i.e. cold plate(s), located on the electronics as seen in FIG. 2. The heat transfer coolant in the indirect cooling method can be a single phase coolant. That is, the coolant always remains a liquid or vapor during the cooling process and thus does not change phase. Alternatively, the coolant can be a two-phase coolant which boils or evaporates at the electronic cold plates and condenses in the radiator.

Simple convection heat transfer methods have been used when the operation of the device is not highly temperature sensitive. Higher operating temperatures and operating temperature swings present in such a system do, however, affect the life of any electronic device. The thermal expansion and contraction of the interface connectors has also been shown to decrease system reliability.

Known convection cooling is practical for cooling the radar antenna and similar non-temperature-sensitive electronics. An antenna is not 100% efficient, and therefore some of the energy sent to the antenna is lost as a result of the antenna inefficiency. This energy is dissipated as heat. This waste heat must be dissipated, but such antennas as are typically not very temperature sensitive and convection cooling is adequate.

Limited temperature control to prevent the opposite problem, namely the electronics from becoming too cold, can be accomplished with the convection cooling methods by shutting off the convective air flow in the direct cooling configurations or by turning the pump off in the indirect convection cooling methods.

Convection cooling is only useful when the ambient temperature or the heat sink is at a lower temperature than the desired electronics temperature. One way to extend the operating range, is to utilize a water boiler. As the radiator temperature reaches the boiling point of water, water can be boiled off, to provide cooling at approximately the boiling point of water. The boiling point of water decreases as the pressure decreases, and so the boiling point temperature drops as the altitude of the airplane increases. However, the major aerodynamic heating of the ambient air surrounding the aircraft occurs at low altitude supersonic flight conditions and at these low altitudes the boiling point of the water is essentially 100° C. A Venturi-type of nozzle can utilize the speed of the air to drop the pressure in the water boiler, thereby lowering the boiling temperature, but the quantity of water needed is too substantial to be practical except for short duration peak load reduction applications. Again, because most electronics must be kept cooler than the sea level boiling point of water, this water boiler method has been considered in the past to have limited applications. Other lower temperature fluids can also be boiled off but these fluids typically pose environmental and logistical supply problems.

Figure 3:
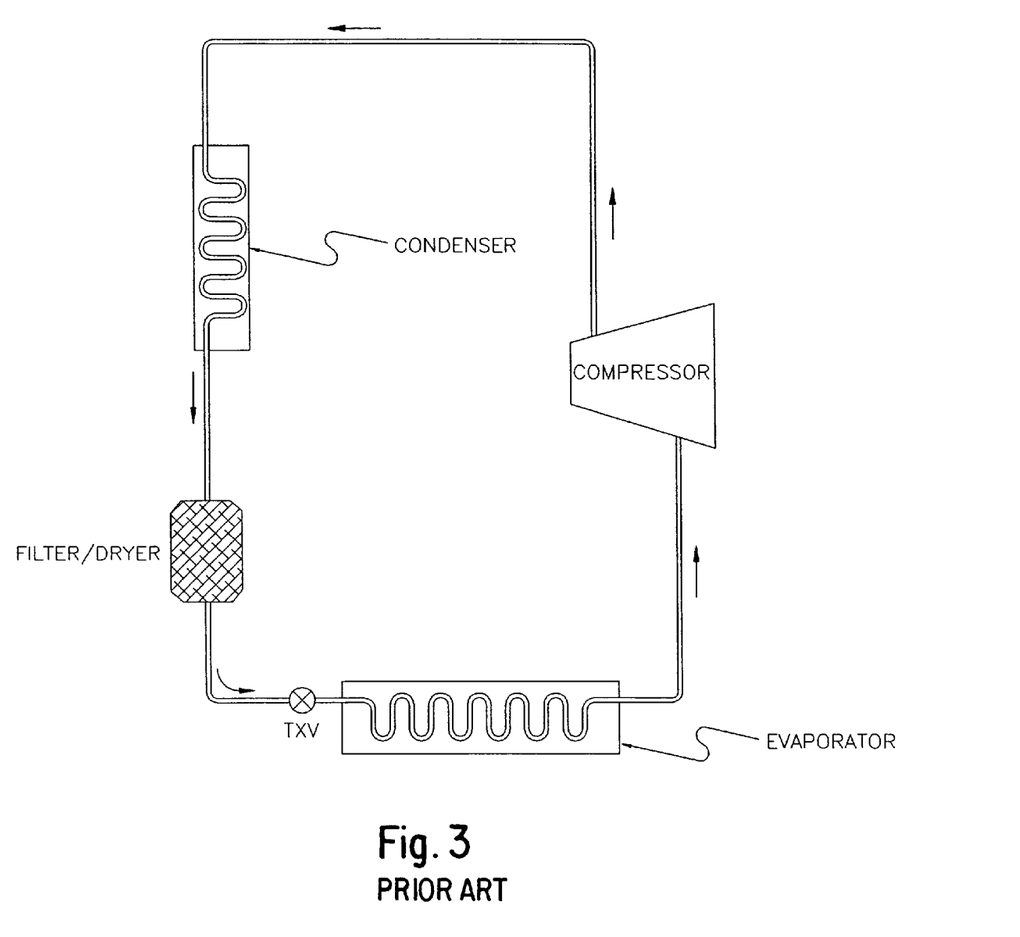
FIG. 3 is a schematic diagram of the above-discussed conventional vapor compression air conditioning system.

Because the simple conduction cooling methods are not adequate for a typical electronics pod, active cooling systems have also been implemented. The most compact and energy efficient active cooling method is the vapor-compression air conditioning system. This known system in its basic form, as shown in FIG. 3, uses a well known evaporator, condenser, compressor and expansion valve. To date, these systems have been added to the existing convection cooling systems.

The system depicted in FIG. 3 also shows a filter-dryer. The filter-dryer is used to prevent clogging of the expansion device. An expansion device comprising a Thermal Expansion Valve (TXV) is used. However, any type of commercially available expansion device such as a capillary tube, electronic expansion valve, low-side or high-side float control, expansion orifice or the like could be substituted for the TXV.

One published previous investigation that addressed the system design for the thermal management of pod electronics was a system developed by Sundstrand. The environmental control units for navigation and targeting pods were developed to dissipate 2.6 kW of heat during flight and 2.0 kW of heat on ground. This study used a R-114 vapor compression cycle employing a semi-hermetic motor-driven rolling-piston rotary compressor, and a conventional thermal expansion valve. The condenser was cooled by a fan on the ground and by ram air during flight. The coolant temperature was maintained by switching between four modes of operation described as (i) heating by way of a heater located in pumped coolant loop, (ii) neutral with no cooling or heating, (iii) bypass with indirect convection cooling to ambient air, and (iv) cooling by using the vapor compression system. This system is representative of known vapor-compression systems which are added to existing systems, in which the complexity of the overall system is undesirably increased.

Figure 4:
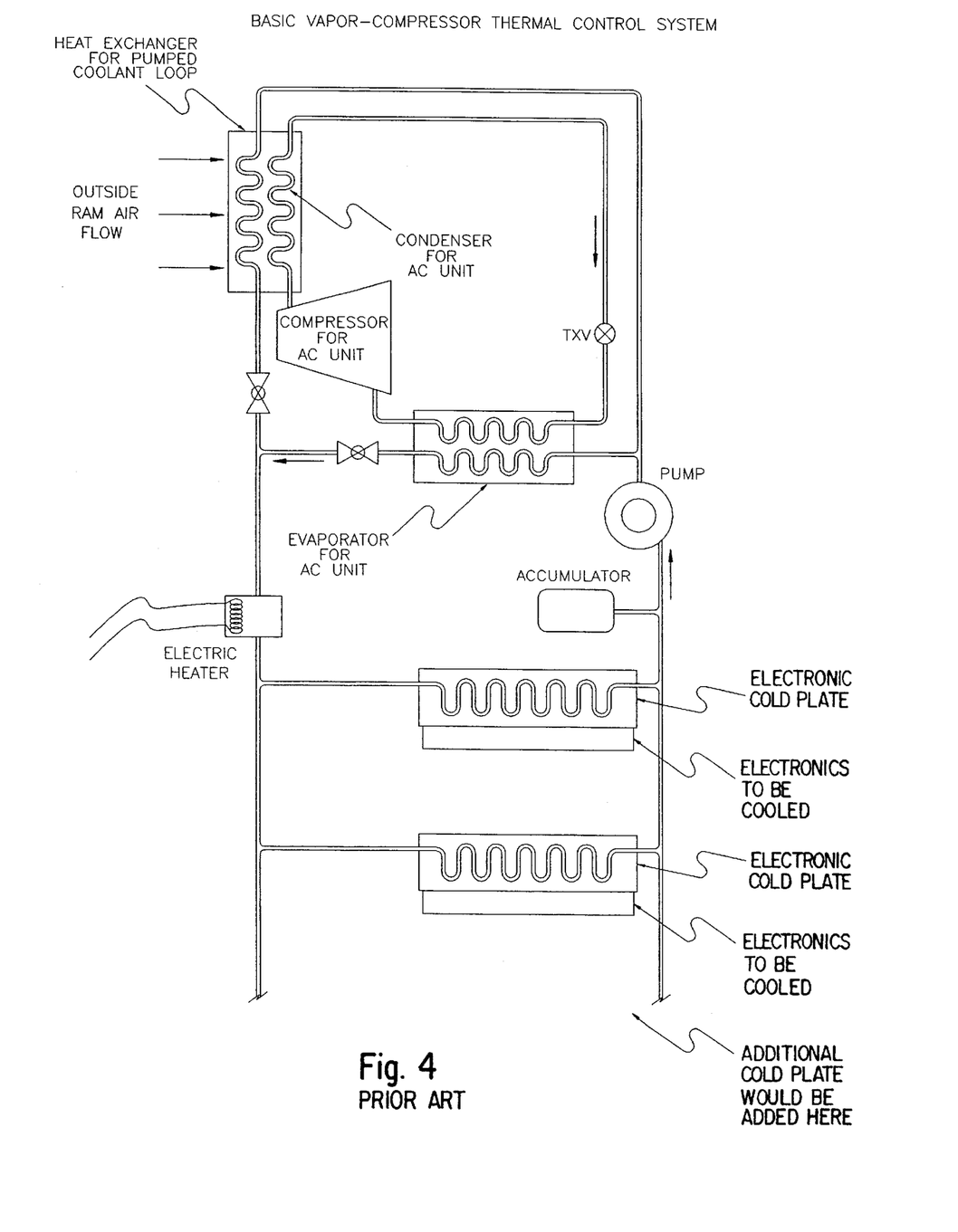
FIG. 4 is a schematic diagram of the above-discussed known thermal control system using vapor-compression, indirection convection cooling and heating.

FIG. 4 is a schematic diagram of a typical thermal control system using a vapor-compression cooling system, indirect convection cooling loop, and a heating loop. In such systems, the coolant which is pumped through the electronics cold plate is a single-phase coolant and is cooled by direct heat transfer with the ram air, or by contact with the evaporator of the vapor-compression air conditioner. This same fluid is heated by the electric heater. The refrigerant of the vapor compression cooling system does not pass directly through the cold plates.

It is an object of the present invention to provide an improved method of providing combined and compact thermal control. This object has been achieved by providing a compact thermal control system in which the refrigerant is circulated through cooling channels adjacent to the pod electronics such that refrigerant passes directly through cooling passages in the electronics cold plate. This arrangement thus forms the evaporator of a heat pump loop or the heat exchanger of a pumped coolant loop, thereby resulting in a more compact arrangement.

A main advantage of the present invention is that the same refrigerant working fluid and many of the same components are used for both convection cooling and compressor-assisted cooling, thereby reducing the total number of components needed. Heat is directly transmitted from the pod electronics to the refrigerant. Depending on the ambient heat rejection capability (e.g. air temperature, air speed), the fluid can be circulated by a compressor forming a heat pump or by a pump forming a pumped single-phase or two-phase loop. Generally speaking, at lower ambient temperatures, the pump is operational while, at less favorable heat rejection conditions the compressor operates thereby elevating the condenser pressure and temperature to cause heat rejection.

BRIEF DESCRIPTION OF THE DRAWINGS

These and further objects, features and advantages of the present invention will become more apparent from the following detailed description of a currently preferred embodiments when taken in conjunction with the accompanying drawings wherein.

DETAILED DESCRIPTION OF THE DRAWINGS

Figure 5:
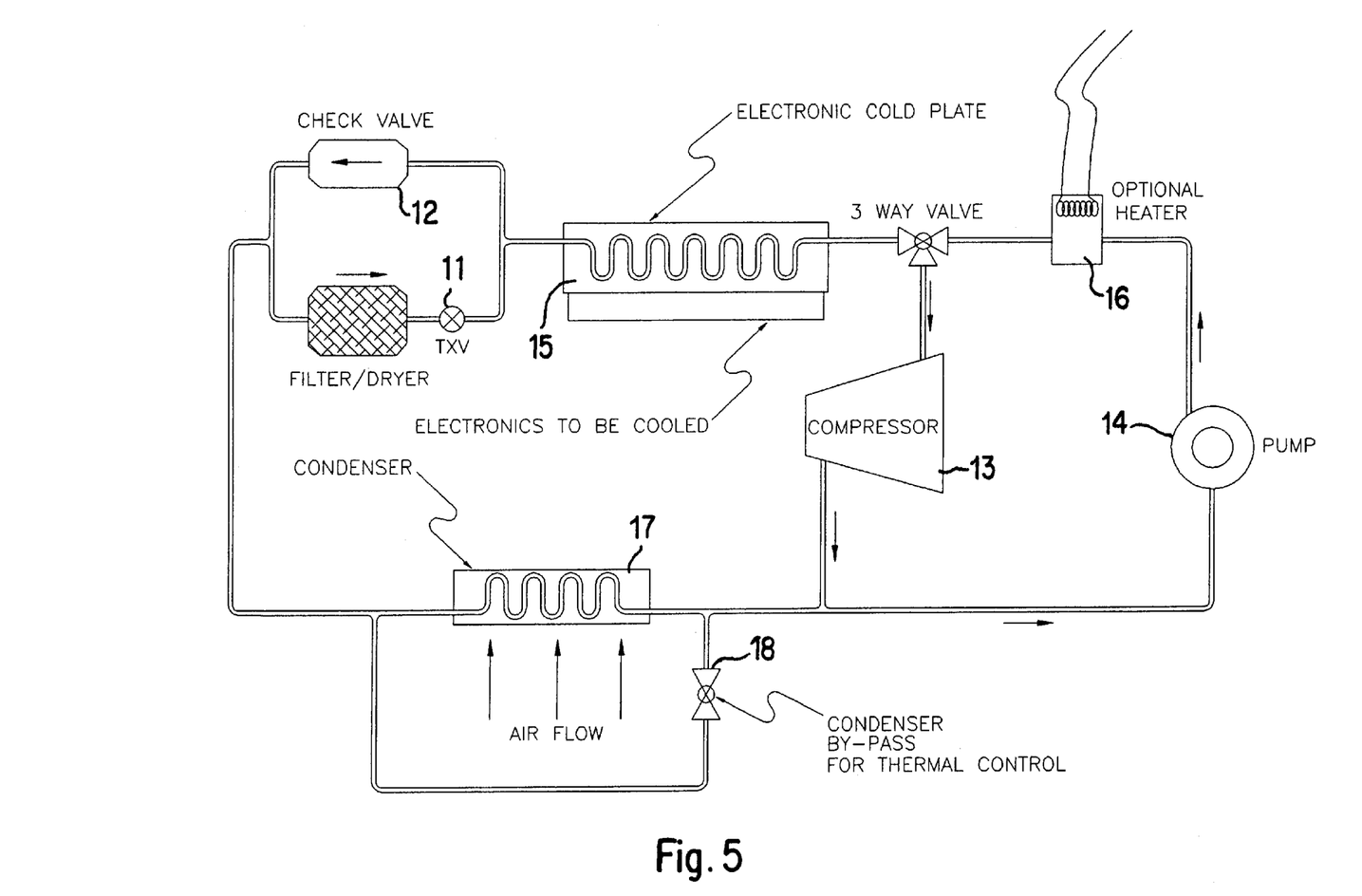
FIG. 5 is a schematic diagram of a first embodiment of the present invention in which a thermal control system uses either a pump or a compressor to circulate cooling fluid.

In the system designated generally by numeral 10 in FIG. 5, a TXV 11 is arranged in parallel with a check-valve 12 to reduce the need to have additional three-way valves, and the flow direction of the compressor 13 is opposed to the flow direction of the pump 14. Thus, the compressed fluid must pass through the TXV 11 prior to entering the electronics cold plate 15 which acts in this embodiment as an evaporator. When the pump 14 is operating, however, the fluid flows through the check-valve 12 and essentially by-passes the TXV 11. The pump 14 provides only enough pressure head to compensate for the frictional loss in the system plumbing and exchangers, whereas the compressor 13 produces a pressure lift thereby creating a thermal lift, elevating the heat rejection radiator (or condenser) to provide the necessary heat transfer.

A heater 16 can optionally be used in the pumped fluid loop to heat the fluid during low ambient temperatures or a by-pass of the heat rejection heat exchanger (condenser 17) can be used to heat the fluid loop. When in pumped loop cooling, the ambient temperature and heat transfer can be such that excessive cooling may occur, resulting in excess cooling and lower than desired temperatures. To avoid this, the cooling system pumped loop can therefore contain a flow bypass 18 and/or the electrical heater 16. The condenser by-pass 18 avoids the use of a heater and can, by itself, provide excellent thermal control by controlling the mixed stream return temperature to the electronic cold plate. The compressor 13 also contains a crankcase heater to avoid condensation of refrigerant therein when the compressor is not operating. When in the pumped cooling mode, the heat absorbed by the refrigerant (or coolant) is directly dissipated to the ambient atmosphere via the refrigerant to the air heat exchanger 17.

From a thermal efficiency stand-point, the combined heat-pump/pumped-coolant-system shown in FIG. 5 is the minimum-energy-consumption approach. That is, a heat pump is not needed when the ambient temperature is sufficiently below the desired electronics temperature. This system is better than the above-discussed known systems having separate heat pump and pumped coolant loops because the present invention has fewer parts, is more compact and is efficient.

Figure 6:
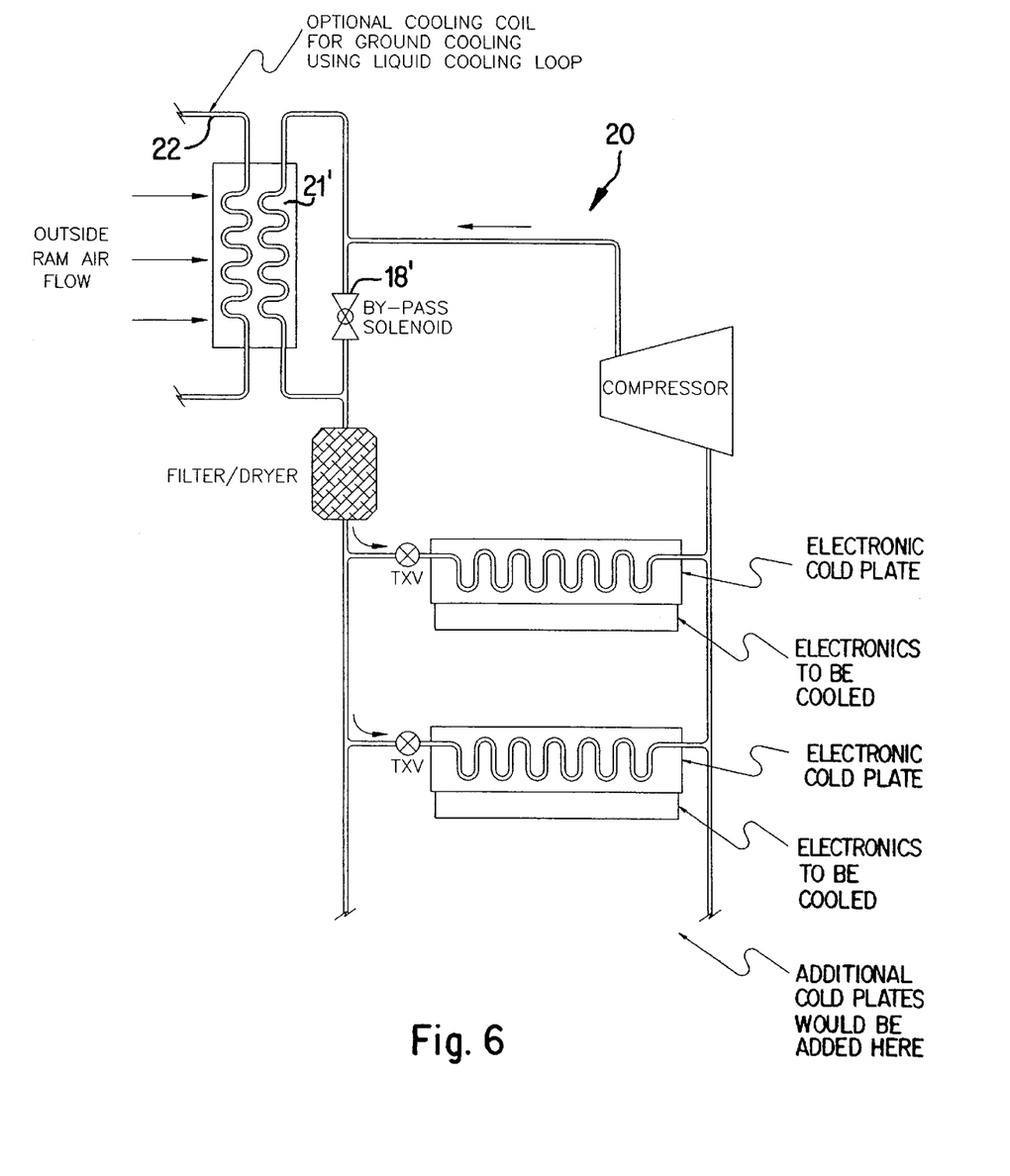
FIG. 6 is a schematic diagram of a second embodiment of the present invention which uses an optional cooling coil.

The number of times that the pumped coolant system can actually be used, instead of the vapor-compression system, is minimal, and the lack of available space in the pod means that the vapor-compression system is more compact and lighter, and thus is more desirable where size and weight considerations are at a premium, particularly because the need for pump, check valves and three-way valve is eliminated. FIG. 6 shows another embodiment of the present invention using a simpler, lighter, and more compact heat pump cooling system designated generally by numeral 20, and is a presently preferred approach when size and weight must be minimized. A bypass 18' is still used to provide thermal control at low ambient temperatures, thereby achieving a simple condenser by-pass to provide the required thermal control. Because it is simpler and has fewer failure points, the system 20 of FIG. 6 is also inherently more reliable.

The refrigerant-to-air heat exchanger 21 can be in the form of a known cross-flow externally finned-tube heat exchanger or a body mounted heat exchanger. Cooling of the heat exchanger 21 (i.e., the heat pump condenser), is accomplished by moving ambient air (outside ram air flow) across the heat exchanger. This air movement is accomplished naturally during flight; however, for ground operations, a conventional fan is used for this purpose. Because the fan (not shown) is not used at all during flight conditions, it is more practical to have the fan unit configured as ground support equipment which is thus not a permanent part of the pod. The fan can, of course, also be integral to the pod.

Instead of using a fan, a second cooling passage 22 can be incorporated into the condenser 21. For ground cooling, a liquid cooling cart which provides chilled liquid coolant can be connected to the second cooling passage loop to provide the ground cooling instead of a fan. This approach also provides a more compact system. While a basic system in accordance with the present invention is shown in FIG. 6, there are certain typical pod system electronics which require since cooling, but are not temperature sensitive, e.g. the radar antenna as above noted. Therefore, the heat dissipation of these devices can be accomplished by using conduction heat transfer to the ambient air even when the ambient air is above 100° C. (212° F.). To provide a second direct or indirect convection heat transfer cooling loop for such low power cooling would be very wasteful of space, weight, and electrical power, and would once again introduce the requirement for a separate plumbing loop, a pump, an accumulator, and heat exchangers. Likewise, these temperature-insensitive components can be cooled in the same way (i.e., at the same temperature) as the temperature sensitive components but this approach requires additional power to cool these components, when the cooling is not needed, and really provides no additional benefit. Because electrical power consumption must also be minimized, this option is typically not viable because the power is simply not available.

Figure 7:
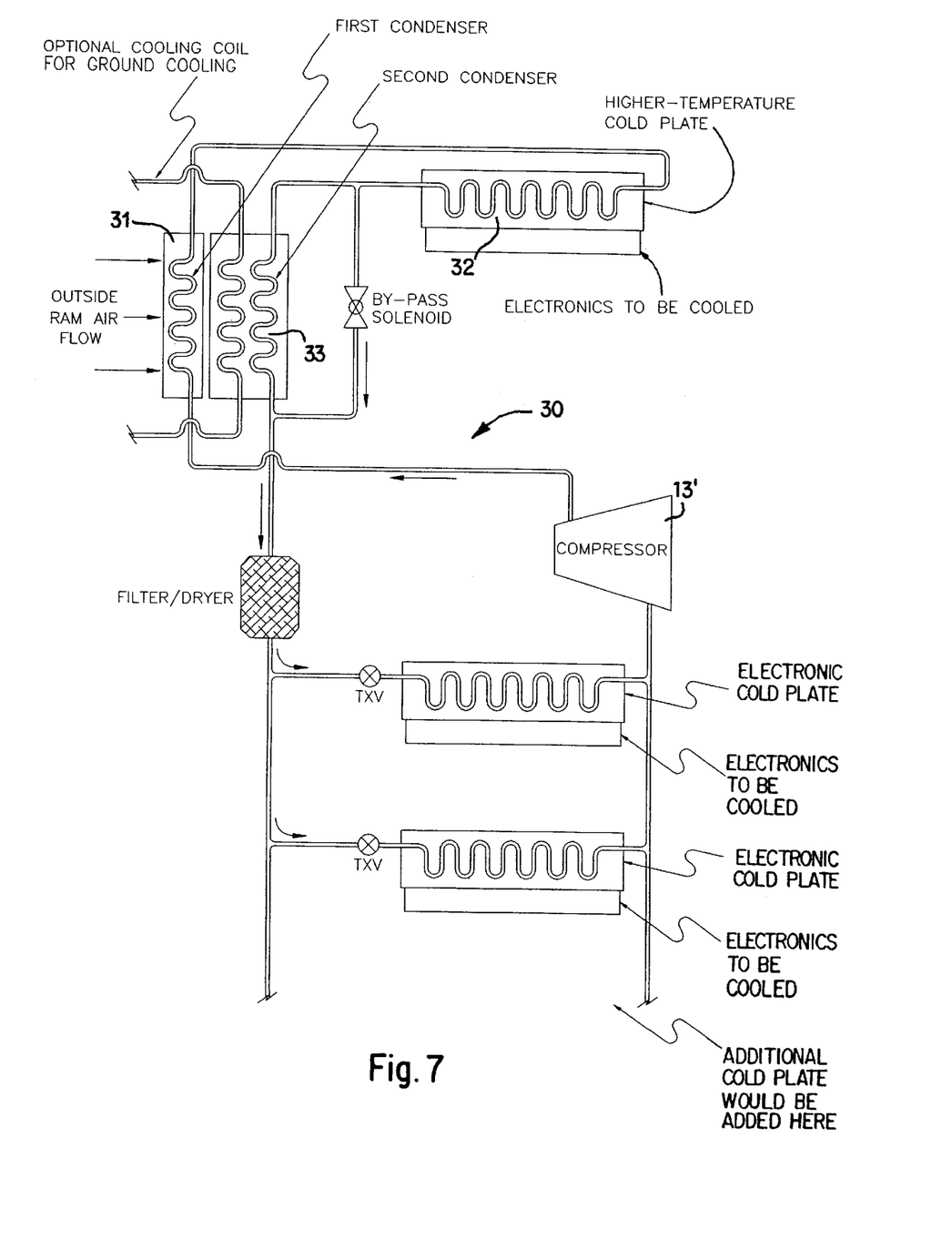
FIG. 7 is a schematic diagram of a third embodiment of the present invention using multiple condensers.

The present invention also includes an innovative cooling approach which utilizes the heat pump loop as shown in the system 30 in FIG. 7, that is will not require any additional pumps and related pump loop components, and at the same time will not increase the energy consumption of the system. The vapor-compression heat pump loop is modified so that downstream of the condenser 31, the condensed working fluid is directed to the higher temperature cold-plate 32 where the cooling temperature in this cold plate is slightly above the ambient temperature, then the working fluid is once again condensed in a second condenser 33. The compressor 13' which is already moving the fluid around the vapor-compression loop thereby provides the pressure differential to force the refrigerant through the higher temperature cold plate 32. The additional work the compressor must do is therefore minimal; that is, the additional work necessary is only that needed to overcome the additional frictional pressure drop due to the additional plumbing.

Figure 8:
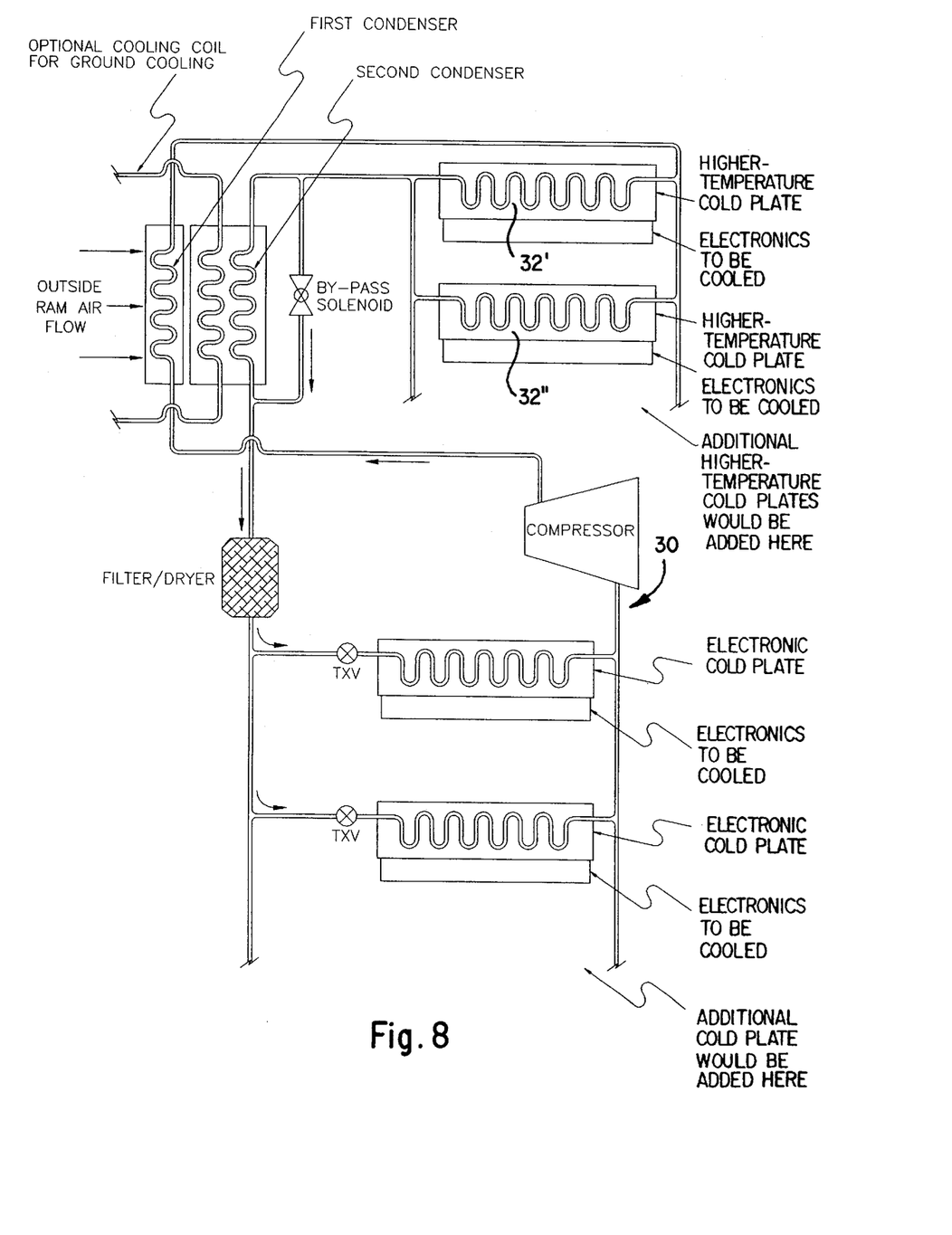
FIG. 8 is a fourth embodiment of the present invention using multiple higher-temperature cold plates.

FIG. 8 shows another embodiment of the basic system shown in FIG. 7 but the former is a system 30' with multiple higher temperature cold plates 32', 32". In yet another embodiment 30" of the FIG. 7 system, the first and second condensers 31, 33 can be packaged as a single unit 34 (FIG. 9) to conserve space and can be coupled with a liquid heat exchanger so that ground cooling can be provided via a pumped coolant loop rather than an external fan.

A known type of water boiler can also be incorporated into the above-described loop to provide a temperature heat sink when the temperature is above the boiling point of water. Because a fighter aircraft only has a limited supersonic flight time when the air temperature can be above 110° C. (typical high speed, low altitude dash of a fighter aircraft lasts only 5 minutes because of the excessive fuel consumption), a water boiler can effectively be used as the heat sink during these short high speed low altitude dashes. The water boiler 41 can be incorporated, for example, into a by-pass circuit around the first condenser in the system 40 shown in FIG. 10.

Figure 9:
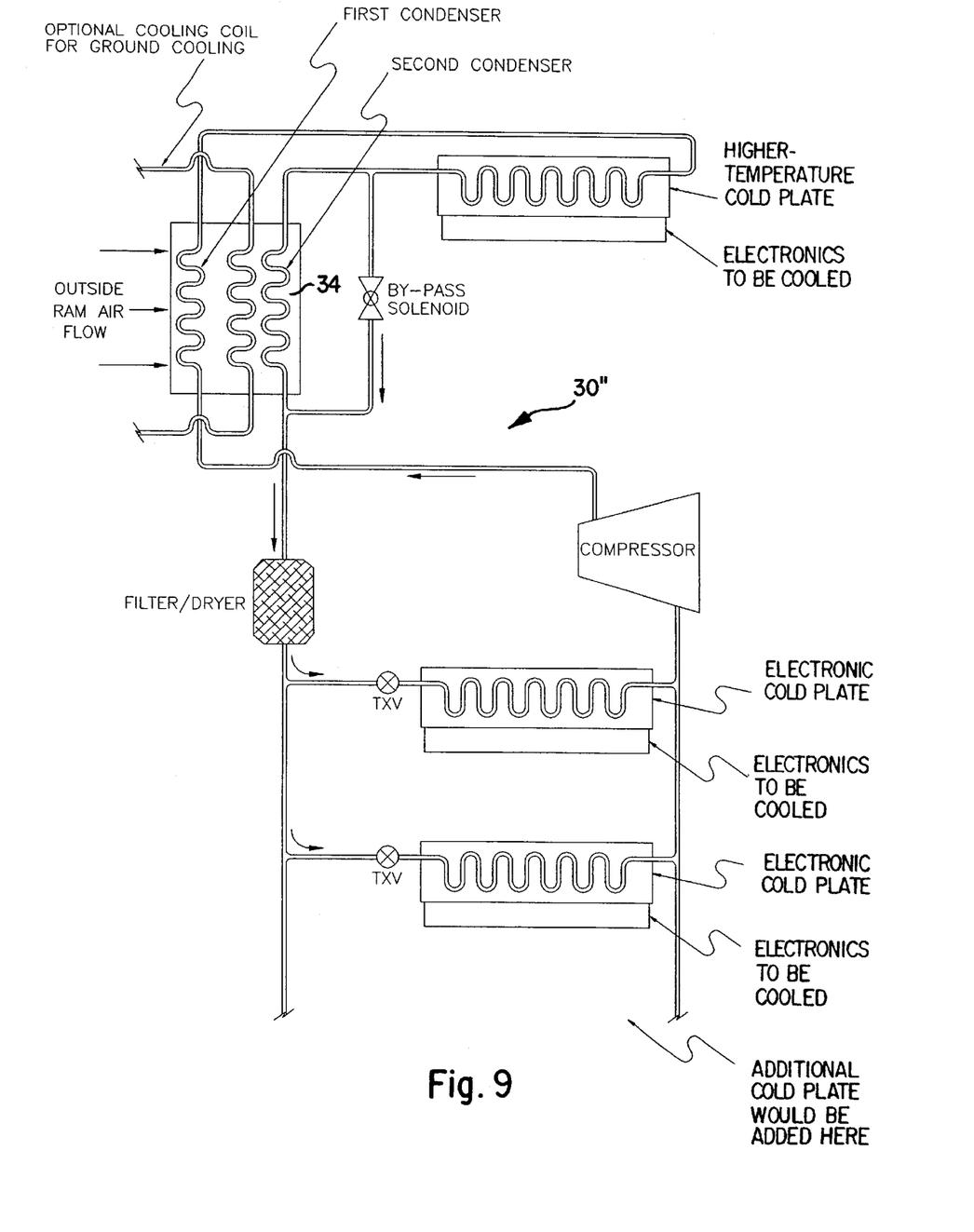
FIG. 9 is a fifth embodiment of the present invention in which multiple condensers are integrated into a single unit.
Figure 10:
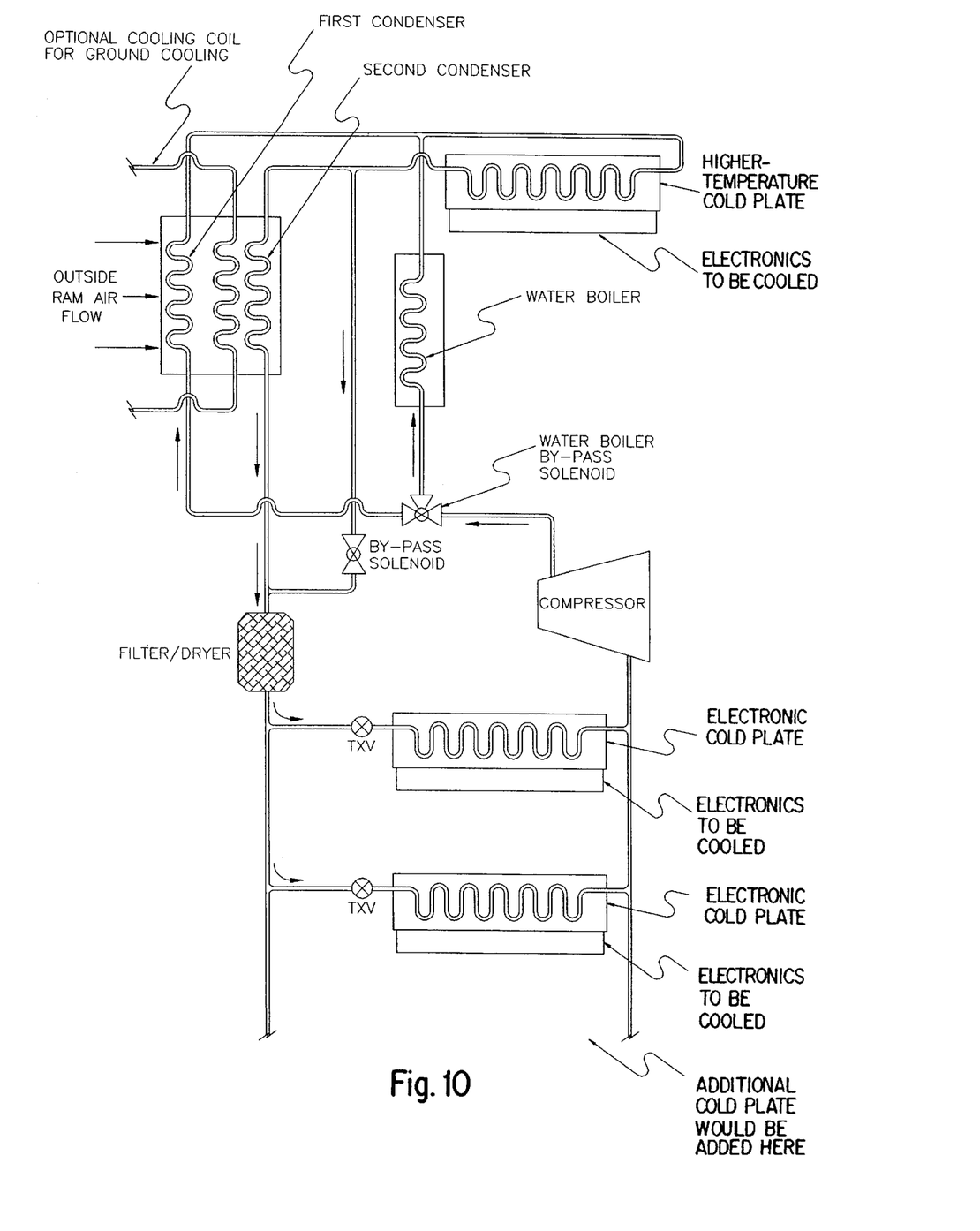
FIG. 10 is a sixth embodiment of the present invention in which a water boiler is incorporated.
Figure 11:
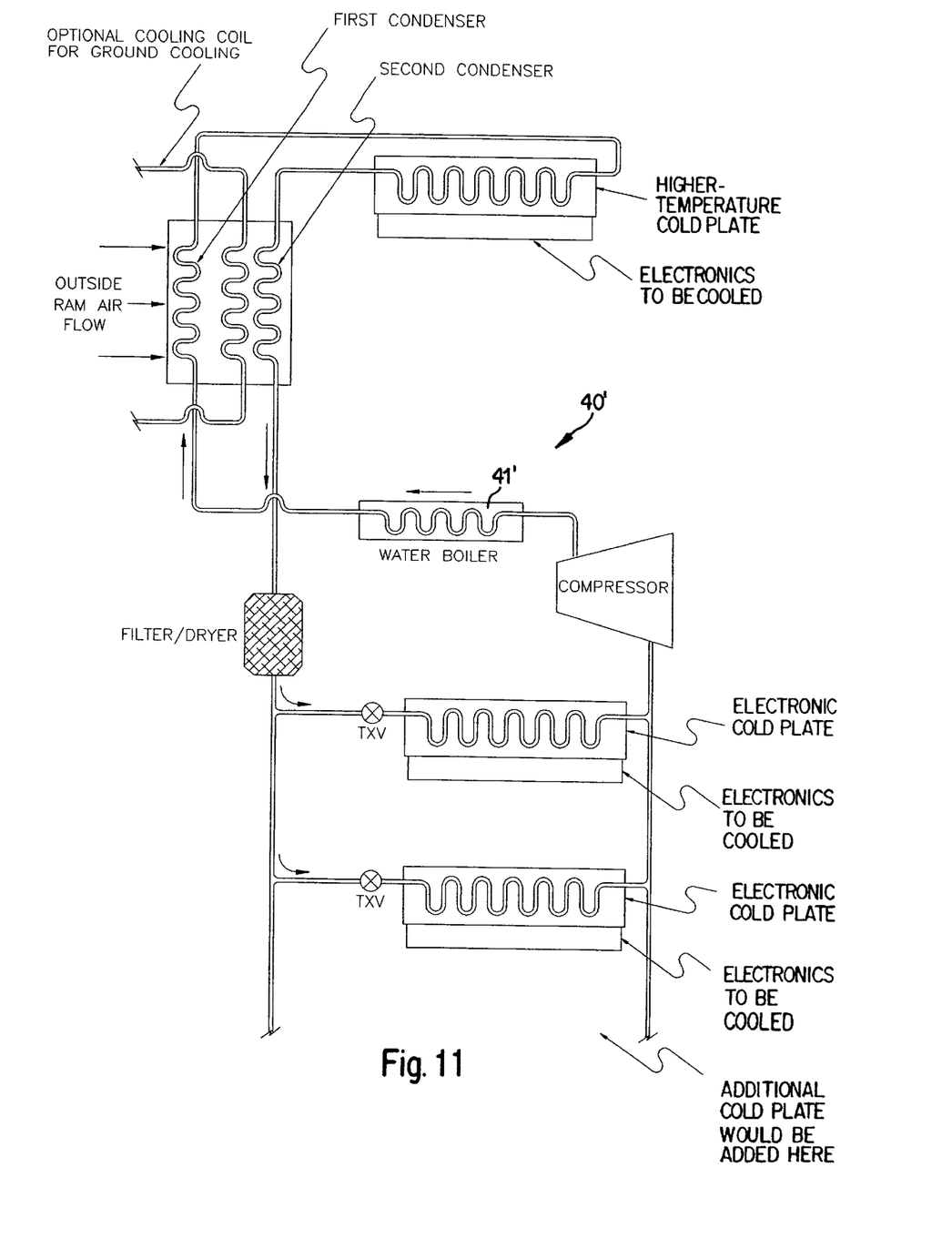
FIG. 11 is a seventh embodiment of the present invention similar to the one shown in FIG. 10 but in which the water boiler is located upstream of the first condenser in the loop as viewed in the direction of coolant flow.
Figure 12:
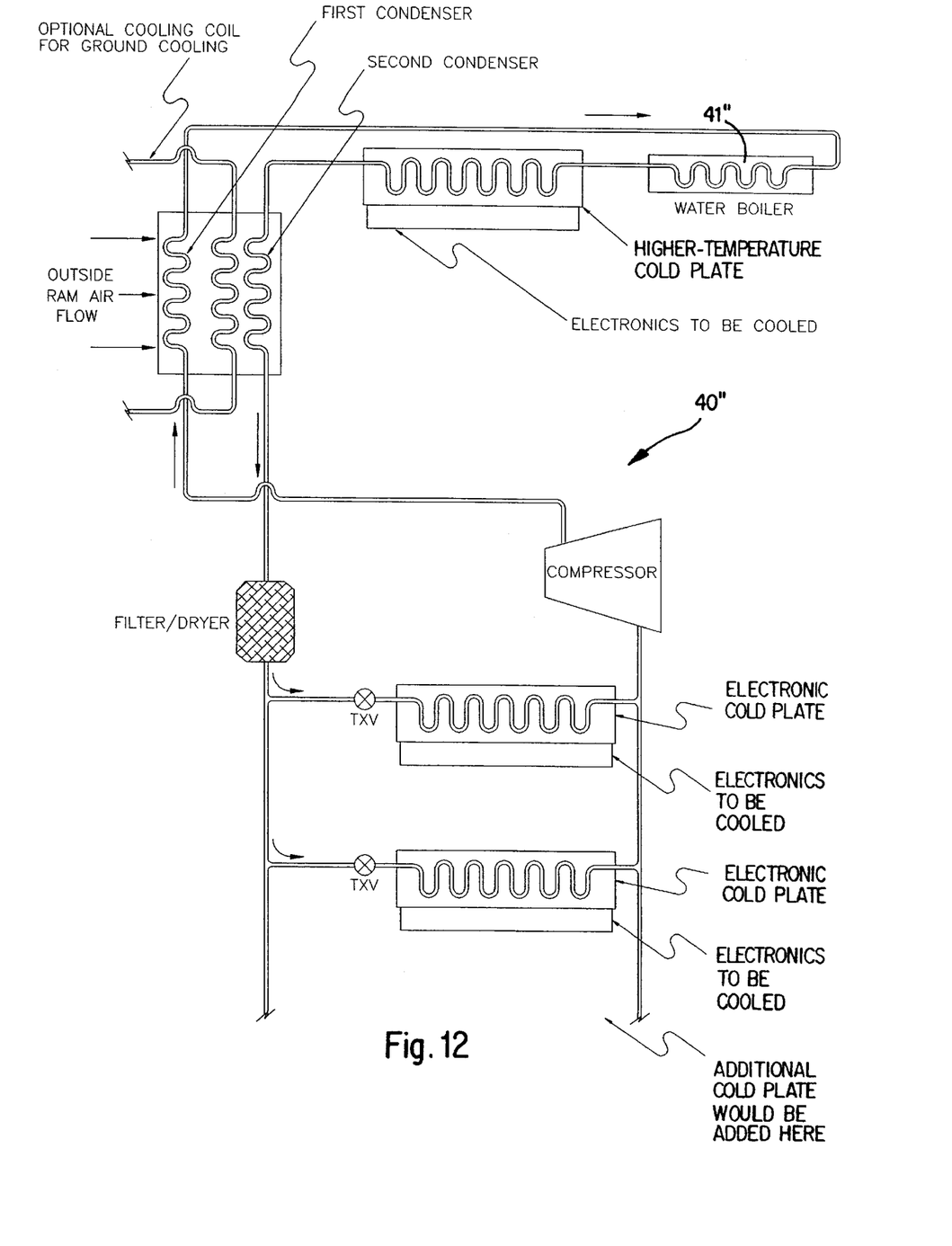
FIG. 12 is an eighth embodiment similar to FIGS. 10 and 11 but with the water boiler located between the first condenser and the higher temperature cold plate.

Alternatively, the water boiler 41' can be located before the first condenser in the plumbing loop as shown in FIG. 11, or can be located after the first condenser and before the higher temperature cold plate as shown in FIG. 12. The second condenser can be plumbed with an optional condenser by-pass to provide cold plate thermal control without heaters as shown in FIGS. 7 through 9, but this optional by-pass has been omitted from FIGS. 10–12 merely for simplicity in illustrating basic constructional differences.

The water boiler 41 in the embodiment shown in FIG. 10 acts as a lower temperature heat sink to replace or by-pass the first condenser, when the air temperature to the condenser exceeds the water boiler's evaporation temperature which typically occurs during the aircraft's supersonic low altitude dash. Because the water boiler's heat sink temperature will be below the condenser's temperature, the compressor discharge pressure is reduced, resulting in a reduced pressure ratio and reduced temperature lift. Therefore, higher performance or reduced energy consumption is achieved. Inasmuch as the water boiler cools the refrigerant to a temperature which is cooler than possible by cooling with the first condenser, the water boiler by-pass also lowers the higher cold plate's temperature during this supersonic low altitude dash portion of the aircraft's flight.

The water boiler 41' in the embodiment of FIG. 11 holds the refrigerant initial condensing temperature to the lessor of the actual condenser temperature or the water boiler's temperature but it does not lower the higher cold plate's temperature because the refrigerant enters the first condenser after leaving the water boiler 41'. However, it also does not require a solenoid valve. Therefore, the use of the water boiler in this embodiment lowers the pressure lift and increases the performance (i.e., reduce energy consumption) of the cycle during the supersonic low altitude dash portion of the aircraft's flight.

The water boiler 41" in the embodiment of FIG. 12 lowers the higher cold plate's cooling temperature during the supersonic low altitude dash portion of the aircraft's flight but does not significantly increase the performance (or lower the energy consumption) nor does it lower the low-temperature cold plate's temperature.

There are instances where the temperature of the higher temperature cold plate is allowed to be quite high as long as the heat is carried away. In those instances, the first condenser can be omitted entirely as seen in the system 50 of FIG. 13 which is similar to FIG. 8 in its other respects. Because the refrigerant leaving the lower temperature cold plates is slightly superheated, the higher temperature heat sink will then further raise the temperature of the refrigerant. This refrigerant is cooled and condensed in the condenser prior to compression.

Figure 13:
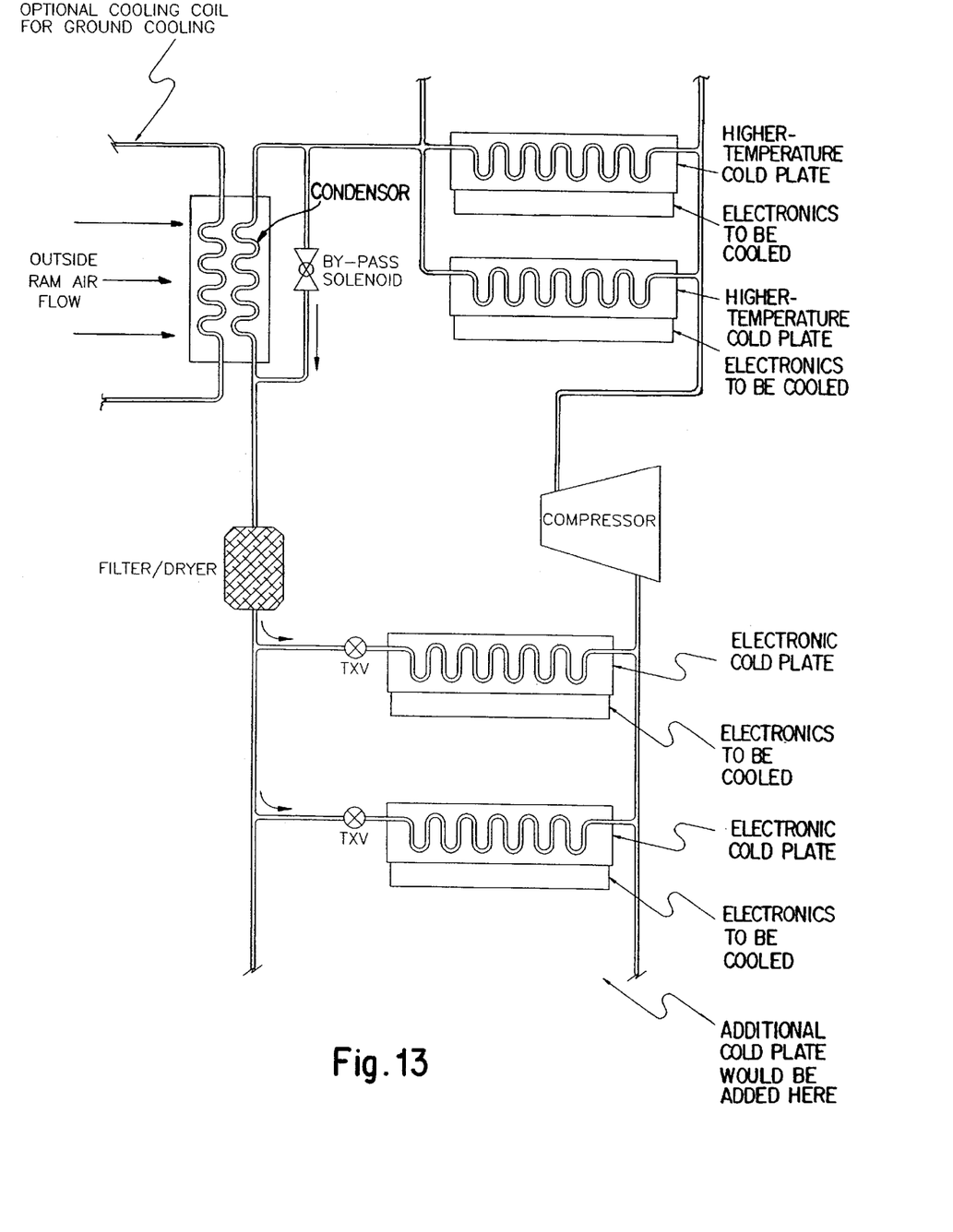
FIG. 13 is a ninth embodiment similar to FIG. 8 in which the higher temperature cold plate is located downstream of the compressor.

An important feature of the embodiment of FIG. 13 is that the higher-temperature cold plate is located after the electronic cold plate (the lower-temperature cold plate). It can be located after the compressor as in FIG. 13, or before the compressor, i.e. between the first electronic cold plate and the compressor (not shown). If the higher temperature cold plate is located after the compressor, the compressor performance is the same as if the higher temperature heat sink was not present because the compressor inlet conditions are not changed. However, if the higher temperature heat sink is located before the compressor, i.e. between the first lower-temperature cold palate and the compressor, then the compressor inlet is heated higher, resulting in increased inlet superheat to the compressor and reduced compressor efficiently.

The location of the higher temperature heat sink, and the use of two condensers depend on the relative quantity of energy introduced in the loop from the higher temperature heat sink. If the cooling load of the higher temperature heat sink is small relative to the cooling load of the low temperature heat sinks, then the higher temperature heat sink can be located directly after the lower temperature heat sinks, because an appreciable quantity of energy will not be added into the refrigerant prior to compression. If an appreciable quantity of energy is added by the higher temperature heat sinks, however, then they should be located after (downstream of) the compressor as in FIGS. 8 and 13.

The configuration in FIG. 13 (i.e., the single condenser) is preferred if the heat sink is intended to be operating at high temperature and if the refrigerant's thermal limit (thermal breakdown) is not approached. If a second condenser as in FIG. 8 is necessary to avoid excessive temperature in the higher temperature heat sink, then the higher temperature heat sink will also be more compact because the refrigerant will condense in the first condenser and then boil again in the higher-temperature heat sink. The heat transfer coefficient for boiling is significantly higher that the single-phase vapor convective heat transfer coefficient. Therefore in the embodiment of FIG. 8 boiling occurs in both the lower and higher temperature heat sinks, whereas in the embodiment of FIG. 13 boiling may occur in only the lower temperature heat sink depending on the heat loads.

The present invention proposed operates with any known working fluid that evaporates and condenses at reasonable pressures for the operating temperatures being used. Because the refrigerant is actually passing through the cold plates which are attached to the electronics, a lower pressure refrigerant allows the construction of these cold plates to be lighter, because they would not have to withstand as high a pressure. Also, in selecting the working fluid, the worst case operating temperature of the condenser should be below the critical point of the working fluid.

Table 1 lists illustrative working fluids for use in the pod thermal control system of the present invention, based on a condenser temperature of 248° F. (120° C.), and cold plate (evaporator) temperatures of 86° F. (30° C.) and 104° (40° C.). Even though EPA regulations preclude the use of CFC refrigerants, they are included for reference purposes. Where EPA regulations require a zero Ozone Depletion Potential (ODP) refrigerant HFC-236ea is a presently preferred choice. If a small ODP is allowable, however, HCFC-123 may be preferred because at this time it is more commonly available and has a low system pressure.

TABLE 1

Potential Working Fluids

| Fluid | $COP_c$ | Cond Pressure [Psia] | Evap Pressure [psia] | Evap Temp [° C.] | Mass Flowrate [kg/sec/kW] | Vapor vol Flowrate [m³/s/kW] |
|---|---|---|---|---|---|---|
| HFC-236ea | 1.5 | 342 | 49 | 40 | 0.016 | 0.73E-3 |
| HFC-245cb | 1.3 | 346 | 60 | 40 | 0.017 | 0.83E-3 |
| CFC-113 | 1.6 | 99 | 11 | 40 | 0.016 | 0.28E-2 |
| CFC-114 | 0.79 | 301 | 49 | 40 | 0.049 | 0.20E-2 |
| HCFC-21 | 1.9 | 283 | 42 | 40 | 0.008 | 0.61E-3 |
| HCFC-123 | 1.6 | 176 | 23 | 40 | 0.014 | 0.14E-2 |
| HCFC-124 | 0.7 | 503 | 87 | 40 | 0.036 | 0.98E-3 |
| HCFC-124a | 1.0 | 475 | 81 | 40 | 0.027 | 0.79E-3 |
| HFC-236cb | 0.2 | 375 | 60 | 40 | 0.190 | 0.684E-2 |
| HFC-236fa | 0.2 | 378 | 60 | 40 | 0.156 | 0.561E-2 |
| HFC-245cb | CPP* | | | 40 | | |
| HFC-227ea | CPP | | | 40 | | |
| HFC-227ca | CPP | | | 40 | | |
| HFC-23 | CPP | | | 40 | | |
| HFC-41 | CPP | | | 40 | | |
| CFC-13 | CPP | | | 40 | | |
| HFC-134a | CPP | | | 40 | | |
| HFC-23 | CPP | | | 40 | | |
| HFC-236ea | 1.2 | 342 | 35 | 30 | 0.172 | 0.108E-2 |
| HFC-245cb | CEQ** | | | 30 | | |
| CFC-113 | 1.2 | 99 | 8 | 30 | 0.018 | 0.438E-2 |
| CFC-114 | 0.4 | 301 | 36 | 30 | 0.079 | 0.424E-2 |
| HCFC-21 | 1.6 | 283 | 31 | 30 | 0.008 | 0.864E-3 |
| HCFC-123 | 1.2 | 176 | 16 | 30 | 0.015 | 0.216E-2 |
| HCFC-124 | 0.5 | 503 | 65 | 30 | 0.044 | 0.160E-2 |
| HCFC-124a | 0.7 | 475 | 60 | 30 | 0.0312 | 0.123E-2 |
| HFC-236cb | CEQ | | | 30 | | |
| HFC-236fa | CEQ | | | 30 | | |
| HFC-245cb | 0.9 | 346 | 43 | 30 | 0.019 | 0.126E-02 |
| HFC-227ea | CPP | | | 30 | | |
| HFC-227ca | CPP | | | 30 | | |
| HFC-23 | CPP | | | 30 | | |
| HFC-41 | CPP | | | 30 | | |
| CFC-13 | CPP | | | 30 | | |
| HFC-134a | CPP | | | 30 | | |
| HFC-23 | CPP | | | 30 | | | where: *CPP means Critical Point Problem,
**CEQ means Compressor Exit Quality Problem Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A thermal control system, comprising a compressor, at least one condenser, an expansion device having a high pressure side and a low pressure side, an electronics package, and at least one evaporator operatively arranged between the expansion device and the compressor, and directly associatable with said electronics package, the at least one evaporator being configured as a cold plate having refrigerant working fluid pass therethrough, and only one by-pass solenoid having a single inlet operatively connected with an outlet of the compressor and a single outlet operatively connected downstream of a last condenser of the at least one condenser at a point at or upstream of the expansion device on the high pressure side as so as to be arranged across all condensers comprising the at least one condenser, the solenoid being actuatable in either a fully opened or a fully closed position to control temperature of the at least one evaporator wherein the at least one condenser includes a cooling coil for connection with a separate cooling system, and a filter/dryer and the expansion device are operatively arranged between the at least one condenser and the at least one evaporator, and said by-pass solenoid being operatively arranged to prevent overcooling of said electronics package associated with the at least one evaporator.

* * * * *